United States Patent
Chen et al.

(10) Patent No.: US 7,512,846 B2
(45) Date of Patent: Mar. 31, 2009

(54) METHOD AND APPARATUS OF DEFECT AREAS MANAGEMENT

(75) Inventors: Shang-Hao Chen, Taoyuan (TW); Shiu-Ming Chu, Taoyuan (TW)

(73) Assignee: Quanta Storage Inc., Guishan Shiang (TW)

( * ) Notice: Subject to any disclaimer, the term of this patent is extended or adjusted under 35 U.S.C. 154(b) by 346 days.

(21) Appl. No.: 11/422,237

(22) Filed: Jun. 5, 2006

(65) Prior Publication Data

US 2007/0300128 A1  Dec. 27, 2007

(30) Foreign Application Priority Data

Jun. 3, 2005  (TW) ............... 94118580 A

(51) Int. Cl.
*G11C 29/00* (2006.01)

(52) U.S. Cl. ............... 714/723; 714/710; 714/6; 714/8; 714/25; 714/742; 714/759; 369/30.11; 369/53.17

(58) Field of Classification Search ........... None
See application file for complete search history.

(56) References Cited

U.S. PATENT DOCUMENTS

| | | | | |
|---|---|---|---|---|
| 4,631,723 A * | 12/1986 | Rathbun et al. | ............. | 714/710 |
| 4,746,998 A * | 5/1988 | Robinson et al. | ........... | 360/72.1 |
| 4,924,331 A * | 5/1990 | Robinson et al. | ........... | 360/72.1 |
| 5,303,219 A * | 4/1994 | Kulakowski et al. | ...... | 369/53.17 |
| 6,031,758 A * | 2/2000 | Katayama et al. | ...... | 365/185.09 |
| 6,169,710 B1 * | 1/2001 | Arai | ................. | 369/30.11 |
| 7,359,263 B2 * | 4/2008 | Ogawa | ................ | 365/200 |
| 2003/0156471 A1* | 8/2003 | Ueda et al. | ................ | 365/200 |
| 2003/0210899 A1* | 11/2003 | Fukuchi et al. | ............ | 386/125 |
| 2004/0130953 A1* | 7/2004 | Ambroggi et al. | ........... | 365/200 |
| 2005/0044459 A1* | 2/2005 | Scheuerlein et al. | ........ | 714/719 |
| 2005/0120265 A1* | 6/2005 | Pline et al. | ................ | 714/7 |
| 2005/0144517 A1* | 6/2005 | Zayas | ................ | 714/8 |
| 2006/0221804 A1* | 10/2006 | Kuroiwa | .............. | 369/275.3 |
| 2006/0245344 A1* | 11/2006 | Song | ................ | 369/275.4 |
| 2006/0250909 A1* | 11/2006 | Chen et al. | ............. | 369/47.11 |
| 2007/0038901 A1* | 2/2007 | Shiota et al. | ................ | 714/54 |
| 2007/0150649 A1* | 6/2007 | Asari et al. | ................ | 711/103 |
| 2007/0168772 A1* | 7/2007 | Marr | ................ | 714/710 |
| 2007/0189143 A1* | 8/2007 | Sasaki | ................ | 369/53.17 |
| 2007/0195623 A1* | 8/2007 | Callaway et al. | ........... | 365/201 |

* cited by examiner

*Primary Examiner*—John P Trimmings

(57) ABSTRACT

A method and the apparatus of defect areas management includes the steps as following: reading a defect area table in a random access memory; if the area is readable, then read the area. If the area is not accessible, then label and add one count in the defect area table of inability to read of the defect area, and else if the count of inability to read of the defect area is more than a predetermined value, then the defect area is defined as the area of being not to be read again. Then the defect area of being not to be read again is skipped and not to be read the next time in order to decrease the total access time.

10 Claims, 2 Drawing Sheets

METHOD AND APPARATUS OF DEFECT AREAS MANAGEMENT

FIELD OF THE INVENTION

The present invention is related to a reading device as a storage medium, and more particularly to a method and apparatus for managing defect areas, wherein the defect area reads will be listed into the defect area table in the storage medium.

BACKGROUND OF THE INVENTION

A storage medium is quite accurate and fragile, where the record areas and marks may be easily damaged and then the information written or read therein may be influenced and defective due to the falling dust, the scratches and even an improper writing thereto. Typically, upon receiving a reading command from a host, the reading device may accordingly start to seek through the storage medium for the area address to be read, and then decode the information of the area address, so as to execute the reading command.

Regarding the reading method disclosed in the Japan Pat. Pub. No. 11-7706, when the defect areas are found during a data reading operation, the defect areas skipping technique will be performed. The respective defect areas of the storage medium will be skipped and not be read until all of the normal areas are read. In this case, the normal areas would be read first, whereby the access time would be decreased. In the previous technology, the situation, which defect areas could be neglected in the first searching, can not be avoided. Thus, it needs to execute a second searching for the defect areas, this still results in time consumption.

Further schemes for reading the defect data written in the storage medium are also developed in this technology. For instance, the host may require the reading device of the storage medium to keep on seeking for the address of a target area, or to suspend the seeking while there is an error existing in seeking for the address of the area or in decoding the data written therein. In the case that the host requires the reading device to keep on seeking for the address, it would take the reading device extra time to seek for the respective addresses of all areas in the storage medium again, which is followed by a decoding operation. Moreover, if there is still an error existing in the decoded data, the host may require the reading device to re-seek for the address, and then the decoding operation is also re-performed. Consequently, the whole system may keep on and thus take much time to perform the cycle of address seeking and data decoding. Even though the host requires the reading device to suspend the seeking of the defect areas or erroneously decoded area upon the present reading, the defect areas as well as the erroneously decoded area will still to be read the next time. Therefore, the above-stated method also fails to decrease the total access time for the storage medium.

As for the data decoding for the audio and/or video medium, it is more important to enhance the continuity of signal displaying and the decoding efficiency, rather than reading out the data written in defect areas. Therefore, it is desirable to have an improved method and apparatus for decreasing the time consumed in seeking for the defect areas and for increasing the efficiency of reading the data written in the storage medium.

SUMMARY OF THE INVENTION

One objective of the present invention is to provide a method and an apparatus for managing the defect areas which would reduce the time consumed for area seeking and enhance the efficiency in reading by checking the defect area table in order to skip the defect areas.

The other objective of the present invention is to provide a method and an apparatus for managing the defect areas which would decrease the total access time by counting the defect areas. When the defect areas reach or exceed a predetermined value, the defect area is defined as an inaccessible area and would be skipped the next time.

In accordance with the objectives mentioned, an apparatus for managing the defect areas of a storage medium is provided, which includes a microprocessor, a reading unit with a decoder and a pick-up head, and a random access memory unit with a defect area table and a buffer. The reading unit and the random access memory unit are controlled by the microprocessor. The data written in the storage medium is read out by the pick-up head, and then transmitted to the decoder so to be decoded. The decoded data is further transmitted to the buffer and stored therein. In this case, the respective addresses of the areas failing to be read are recorded in the defect area table.

Furthermore, a method for managing the defect areas of a storage medium is also provided, which includes the step of reading a defect area table in a random access memory, reading the area if readable or adding one to the inaccessible count in the defect area table if else, and defining the area whose inaccessible count reaches or exceeds a predetermined value as a defect area. In a subsequent reading cycle, the defect area would be skipped and is not to be read, so that the total access time for the storage medium would be decreased.

BRIEF DESCRIPTION OF THE DRAWINGS

The foregoing and other features and advantages of the present invention will be more clearly understood through the following descriptions with reference to the drawings, wherein.

DETAILED DESCRIPTION OF THE INVENTION

The present invention will now be described more specifically with reference to the following embodiments. It is to be noted that the following descriptions of preferred embodiments of this invention are presented herein for the purpose of illustration and description only; it is not intended to be exhaustive or to be limited to the precise form disclosed.

Figure 1:
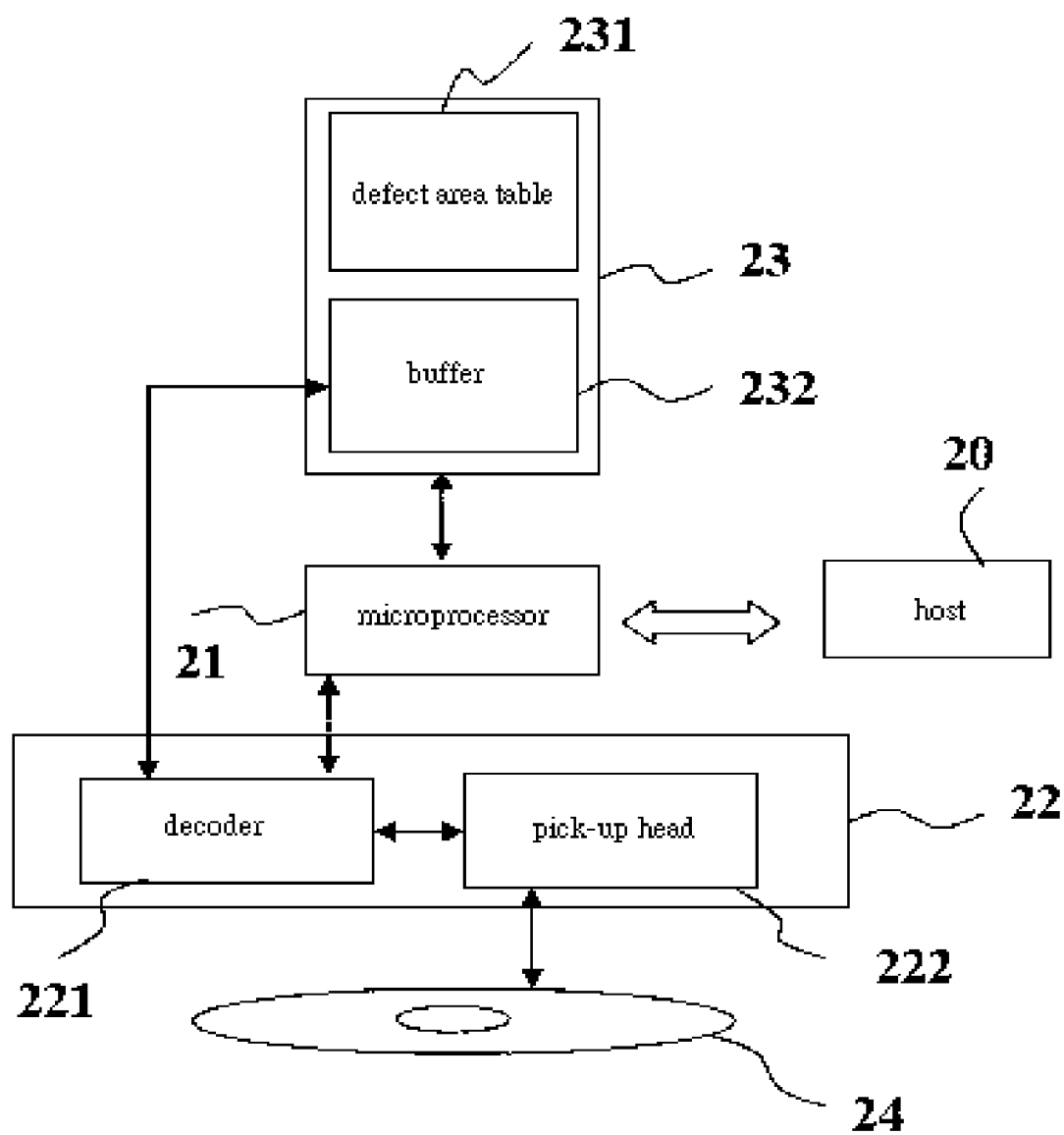
FIG. 1 is a block diagram showing the apparatus for managing the defect areas according to a preferred embodiment of the present invention.

With reference to FIG. 1, an apparatus for managing the defect areas of a storage medium according to the present invention is schematically illustrated. In a preferred embodiment, the apparatus is configured in a reading device, which includes a microprocessor 21, a reading unit 22 and a random access memory 23. The host 20 sends out a command to the microprocessor 21, and thereby to control the reading unit 22. The reading unit 22 includes a decoder 221 and a pick-up head 222, where the data written in the storage medium 24 is read out by the pick-up head 222 and then transmitted to the decoder 221 for decoding. The random access memory 23 including a defect area table 231 and a buffer 232 is also controlled by the microprocessor 21. In this case, the defect area table 231 is selected from a static random access memory (SRAM), a synchronous dynamic random access memory (SDRAM), a dynamic random access memory (DRAM), or an extended data out random access memory (EDORAM), while the buffer 232 is selected from SDRAM, DRAM, or EDORAM. The respective addresses of the areas failing to be read are recorded in the defect area table 231, and the decoded data of the storage medium 24 is transmitted to the buffer 232 and stored therein.

Figure 2:
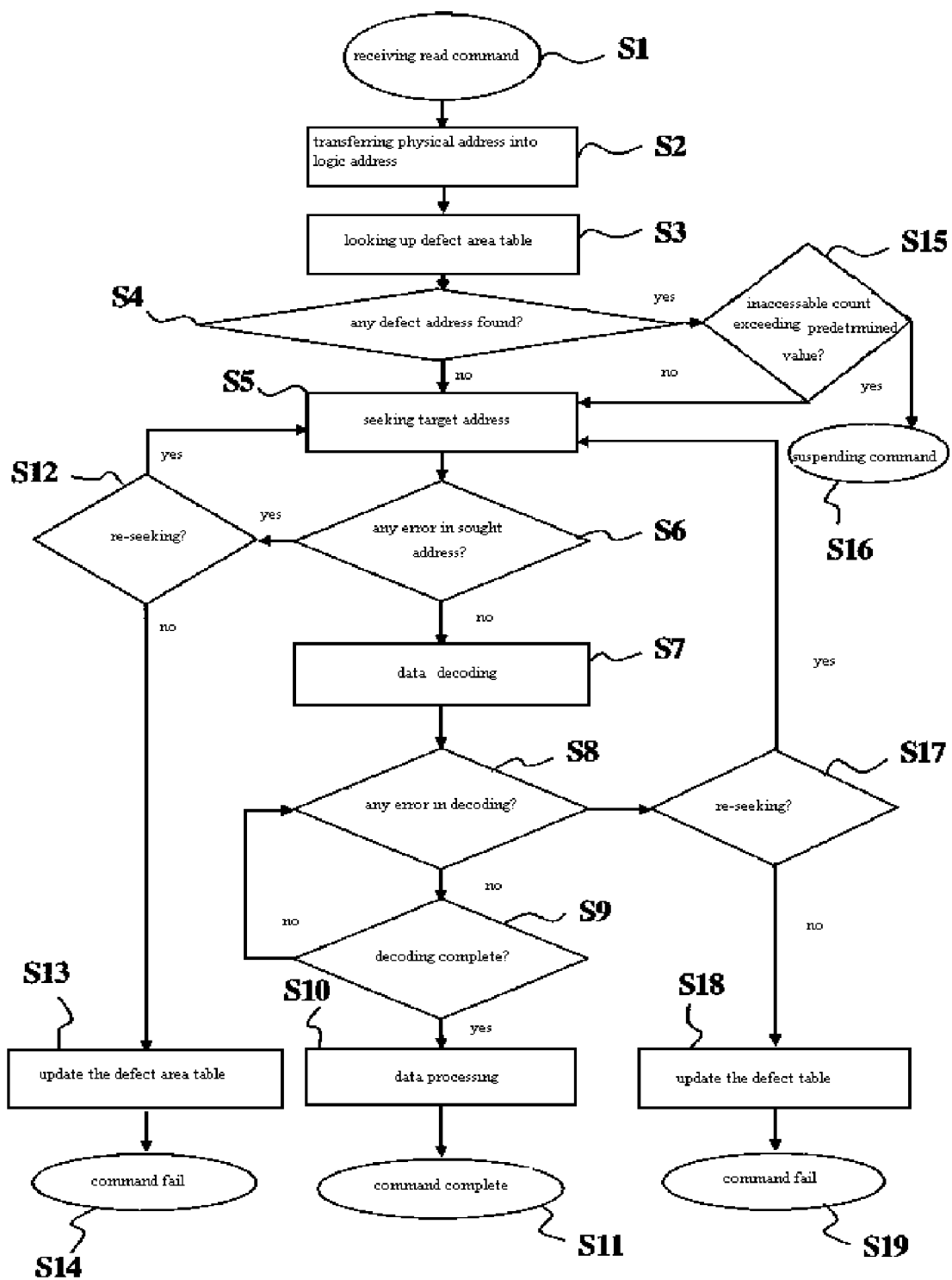
FIG. 2 is a flowchart illustrating the steps of the method for managing the defect areas according to a preferred embodiment of the present invention.

Please refer to FIG. 2, which is a flowchart illustrating the steps of the method for managing the defect areas according to a preferred embodiment of the present invention. To be more specific, the method includes the following steps of:

step S1: the reading device for the storage medium receiving a read command from the host 20, and accordingly, selecting a target data;

step S2: the microprocessor transferring the physical address of the selected target data recorded on the storage medium 24 into a logic address that is readable and identifiable for the reading device;

step S3: looking up the defect areas listed in the defect area table 231 configured in the random access memory unit 23;

step S4: determining whether the address of the area to be read is listed in the defect area table 231, and executing the step S15 if the address of the area to be read is listed in the defect area table 231 and proceeding with step S5 if the address of the area to be read is not listed in the defect area table 231;

step S5: the pick-up head 222 seeking for the address of the target area on the storage medium 24;

step S6: determining whether there is an error existing in the sought address of the target area, i.e. determining whether the target area is a defect area, and executing step S12 if the target area is a defect area and proceeding with step S7 if the target area is not a defect area;

step S7: the decoder 221 decoding the data written in the target area;

step S8: determining whether there is an error existing in the decoded target area, and executing step S17 if there is an error existing in the decoded target area and proceeding with step S9 if there is no error existing in the decoded target area;

step S9: determining whether the decoding is completed, and proceeding with step S10 if the decoding is completed and returning to step S8 if the decoding is not yet completed;

step S10: processing the decoded data;

step S11: the read data command being completed;

step S12: determining whether a re-seeking is to be executed, and returning to step S5 if the re-seeking is to be executed and proceeding with step S13 if the re-seeking is not to be executed;

step S13: supplementing the address of the defect area into the defect area table if the sought defect area is fresh, and adding one to the inaccessible count of the defect area listed in the defect area table if else, so as to update the defect area table;

step S14: suspending the reading command;

step S15: determining whether the inaccessible count of the defect area exceeds a predetermined value, and returning to step S5 if the inaccessible count does not exceed the predetermined value and proceeding with the next step if else;

step S16: suspending the reading command;

step S17: determining whether a re-seeking is to be executed, and returning to step S5 if the re-seeking is to be executed and proceeding with step S18 if the re-seeking is not to be executed;

step S18: supplementing the address of the defect area into the defect area table if the sought defect area is fresh, and adding one to the inaccessible count of the defect area listed in the defect area table if else, so as to update the defect area table;

step S19: suspending the reading command.

According to the present invention, the respective addresses of defect areas are listed in a defect area table and managed therewith. Upon reading the target area, it is first to look up the defect area table configured in the random access memory, and thereby to determine if the target area to be read is listed therein, so as to skip reading the defect areas. As a result, the time consumed for the area seeking is reduced and the efficiency of reading is thus enormously enhanced, so that the total access time for the storage medium is dramatically decreased. In order to improve the completeness of data reading, moreover, it adopts an inaccessible count to define the level of damage to the defect area. The defect area with an inaccessible count exceeding a predetermined value would be skipped upon reading and is not to be read anymore. On the other hand, the area with an inaccessible count failing the predetermined value would be read again, so as to confirm if such area is still readable.

Therefore, while adopting the method according to the present invention, the data written in the target area would be successfully read out upon reading if such target area is considered readable, and otherwise, the defect area table would be updated by adding one to the inaccessible count of the defect area listed therein. Once the inaccessible count of a defect area reaches or exceeds a predetermined value, such defect area would be defined as an inaccessible area which would be skipped and is not to be read in the subsequent reading cycles. In this way, the efficiency of data reading, including the audio data and video data, is dramatically enhanced with respect to the conventional schemes. Hence, the present invention not only has a novelty and a progressive nature, but also has an industry utility.

The above statements are to explain the preferred embodiment of the invention, but not to put any restriction on the invention. Therefore, any modification or variation made for the same purpose would still be in the scope of the present invention.

What is claimed is:

1. A method for managing at least a defect area comprising the steps of:
   (1) a reading device selecting a target data;
   (2) a defect area table, which lists a defect area, on a storage medium being looked up;
   (3) determining whether a first target area is found in said defect area table; and
   (4) said first target area being read with said reading device when said first target area in step (3) is not found, and then the reading of said first target area being suspended;
   wherein, when said first target area in step (3) is found, following steps are executed:
   (3-1) determining if a count of said defect area exceeds a predetermined value; and
   (3-2) said first target area being read with said reading device if said count does not exceed said predetermined value, and the reading of said first target area being suspended if said count exceeds said predetermined value.

2. The method of claim 1, wherein it is determined in step (3) whether said first target area has an address listed in said defect area.

3. The method of claim 1 further comprises the steps of:
   (4-1) checking if there is an error at the time of reading said first target area in step (4);

(4-2) determining if step (4) is to be performed again when there is an error at the time of reading said first target area; and (4-3) returning to step (4) if it is determined that step (4) is to be performed again, and then updating said defect area table.

4. The method of claim 3, wherein it is determined in step (4-1) that if there exists an error in an address of said first target area.

5. The method of claim 3, wherein it is determined in step (4-1) that if there exists an error while decoding said target data.

6. The method of claim 5, wherein it is determined in step (4-1) that if the decoded target data is correct.

7. The method of claim 3, wherein in said defect area table in step (4-3) is updated with supplementing a second target area.

8. The method of claim 1, wherein said defect area table is updated with supplementing a second target area if it is failed to find said first target area therein, or with adding one to said count if said first target area is found therein.

9. The method of claim 8, wherein if the count of the defect area listed in the defect area table reaches or exceeds said predetermined value, the defect area is labeled as an inaccessible area.

10. The method of claim 1, wherein the defect area table comprises an inaccessible count and an address of said defect area.

* * * * *